United States Patent
Barton et al.

(10) Patent No.: US 7,633,743 B2
(45) Date of Patent: Dec. 15, 2009

(54) WALL MOUNTED CONTROLLER ASSEMBLY

(75) Inventors: Eric J. Barton, Eden Prairie, MN (US); Run Qing Li, Tianjin (CN)

(73) Assignee: Honeywell International Inc., Morristown, NJ (US)

( * ) Notice: Subject to any disclaimer, the term of this patent is extended or adjusted under 35 U.S.C. 154(b) by 397 days.

(21) Appl. No.: 11/457,689

(22) Filed: Jul. 14, 2006

(65) Prior Publication Data

US 2008/0013259 A1    Jan. 17, 2008

(51) Int. Cl.
 *H05K 7/12* (2006.01)
(52) U.S. Cl. ................... 361/679.01; 361/681
(58) Field of Classification Search ........... 361/679, 361/679.01, 679.21
See application file for complete search history.

(56) References Cited

U.S. PATENT DOCUMENTS

| | | | |
|---|---|---|---|
| 4,295,180 A | 10/1981 | Herron et al. | |
| 4,300,199 A | 11/1981 | Yoknis et al. | |
| 4,394,708 A | 7/1983 | Kasprzyk | |
| 5,099,390 A | 3/1992 | Michaud | |
| 5,107,918 A | 4/1992 | McFarlane et al. | |
| 5,485,954 A | 1/1996 | Guy et al. | |
| 5,673,850 A | 10/1997 | Uptegraph | |
| 5,729,442 A | 3/1998 | Frantz | |
| 6,362,953 B1 * | 3/2002 | Ohlwine et al. | 361/681 |
| 6,398,594 B1 | 6/2002 | Bonilla et al. | |
| 6,757,155 B2 * | 6/2004 | Koike et al. | 361/600 |
| 7,210,963 B2 * | 5/2007 | Chintala et al. | 439/594 |

OTHER PUBLICATIONS

Photograph of Honeywell Thermostat, Chromotherm III T8600C90099547, prior to Jul. 14, 2006.
Photograph of Honeywell Thermostat, CT3611R44500329, prior to Jul. 14, 2006.
Photograph of Honeywell Thermostat, SN28002, prior to Jul. 14, 2006.
Photograph of Honeywell Thermostat, T8511M10020149, prior to Jul. 14, 2006.
Photograph of Honeywell Thermostat, TH3110, prior to Jul. 14, 2006.
Photograph of Honeywell Thermostat, TH5110, prior to Jul. 14, 2006.
Photograph of Honeywell Thermostat, TH6220D10280515, prior to Jul. 14, 2006.
Photograph of Honeywell Thermostat, TH8320410080448, prior to Jul. 14, 2006.

(Continued)

*Primary Examiner*—Jayprakash N Gandhi
*Assistant Examiner*—Ingrid Wright

(57) ABSTRACT

Controller assemblies including a control unit releasably supported to a mounting plate are disclosed. An illustrative controller assembly can include a mounting plate and a control unit that can be attached together via a number of latching mechanisms and corresponding mating recesses. Each latching mechanism can include a bendable latch and a latch shroud, which together are adapted to fit within a clearance area of the mating recess. The control unit can be removed from the mounting plate by rotating the control unit away from the mounting plate via a finger grip located along an edge of the assembly. The latching mechanisms can be configured to permit the staged removal of the control unit, reducing the force required to remove the control unit from the mounting plate.

19 Claims, 8 Drawing Sheets

OTHER PUBLICATIONS

Photograph of Hunter Thermostat, Model 44100, prior to Jul. 14, 2006.
Photograph of Lux Thermostat, Model 1500, prior to Jul. 14, 2006.
Photograph of Ritetemp Thermostat, Model 8030, prior to Jul. 14, 2006.
Photograph of White Rodgers Thermostat, Model 1F95, prior to Jul. 14, 2006.
Install Guide for Ritetemp Thermostat 8082, 6 pages, prior to Jul. 14, 2006.
White Rodgers, "90 Series Blue Single Stage Thermostat with Automatic Heat/Cool Changeover Option," 8 pages, prior to Jul. 14, 2006.

* cited by examiner

WALL MOUNTED CONTROLLER ASSEMBLY

FIELD

The present invention relates generally to the field of control devices. More specifically, the present invention relates to the field of wall mounted controller assemblies employing a control unit releasably supported to a mounting plate.

BACKGROUND

Controllers are used in a wide variety of systems for controlling various functions in homes, office buildings, or other enclosed spaces. In heating, ventilation, and air conditioning (HVAC) systems, for example, such controllers are often used to monitor and control various environmental conditions such as temperature, humidity, venting, air quality, etc. occurring within an enclosed space. Typically, such controllers include a keypad, display panel, a number of switches, and a printed circuit board, each of which can be assembled together within a controller housing and mounted to a wall, frame, or other suitable support panel.

In some designs, a mounting plate can be provided to facilitate electrical connection of the controller to several wire leads located within the support panel. With respect to some wall-mounted thermostat controllers, for example, a wall mounting plate may be provided to facilitate attachment of the controller to a wall containing several wire leads connected to a furnace, boiler, air-conditioner, heat-pump, humidifier/dehumidifier, air-filter, and/or other HVAC component. Typically, the electrical connection of the controller to the mounting plate is accomplished using a pin-in socket connector adapted to receive several connector pins located on the printed circuit board of the controller. In some thermostat assemblies, for example, the mounting plate may include a terminal block having several socket inlets each adapted to receive a corresponding connector pin extending outwardly from the rear of the controller in order to permit the thermostat to be quickly removed from the mounting plate for servicing or maintenance.

The attachment and subsequent removal of the controller from the mounting plate can present a burden to the installer, particularly in those designs where removal of the controller is not intuitive and/or where a significant amount of force is required to disconnect the two components from each other. Prior to installation, the controller and mounting plate are typically separated from each other to permit the installer to first attach the mounting plate to the panel surface and provide the necessary wiring connections to the terminal block. Once the mounting plate is mounted to the panel surface, installation of the controller typically requires the installer to push and/or rotate the controller into place onto the mounting plate. The controller can then be subsequently removed from the mounting plate should servicing or maintenance of the controller become necessary.

In some designs, the process of attaching and/or removing the controller from the mounting plate can result in buckling or bending of the connector pins, causing damage to the controller. In hinged mounted designs, for example, the rotational forces or moments applied to the connector pins as the controller is rotated into place on the mounting plate can cause them to buckle or deform if the pins are not aligned with the socket inlets. In some cases, the misalignment of the controller relative to the mounting plate can also cause damage to the connector pins as the controller is connected to the mounting plate. For example, in straight-in designs where the controller is attached to the mounting plate in a direction normal to the panel surface, a misalignment of the controller can cause the connector pins to buckle or deform as the two components are brought together.

The static interconnect friction of the connector pins within the socket inlets can also render removal of the controller from the mounting plate difficult. In those designs employing multiple connector pins, for example, the pulling and/or rotating force required by the installer to overcome the friction of the connector pins within the socket inlets may be significant, making removal of the controller more difficult. In addition, in those hinged-mounted designs where the controller is adapted to be rotated away from the mounting plate during disassembly, the moments applied to the pins when removed from the socket inlets can cause the pins to bend or deform, producing forces on the pins that can lead to failure of the junction between the pin and the printed circuit board. In surface mounted (SMT) designs where the connector pins are attached directly to the surface of the printed circuit board, for example, these pin moments can lead to wear or cracks on the surface mounts supporting the pins. Furthermore, if the pins are bent during removal from the terminal block, they may be more likely to buckle during subsequent attachment of the controller to the mounting plate due to the misalignment of the pins with the terminal block openings.

SUMMARY

The present invention relates generally to wall mounted controller assemblies employing a control unit releasably supported to a mounting plate. An illustrative controller assembly can include a mounting plate and a control unit that can be attached together via a number of latching mechanism and mating recesses. In certain embodiments, for example, the mounting plate can include a number of upper latching mechanisms adapted to secure to a number of upper mating recesses on the control unit, and a number of lower latching mechanisms adapted to secure to a number of lower mating recesses on the control unit. Each of the upper and/or lower latching mechanisms can include a bendable latch and latch shroud, which together can be configured to fit within a clearance area of the mating recess. The latch shrouds can be configured to facilitate proper alignment of the control unit to the mounting plate, and act to protect the bendable latches from damage during assembly and/or disassembly.

The mounting plate and control unit may include an inset portion forming a finger grip to facilitate the removal of the control unit from the mounting plate. In some embodiments, for example, detachment of the control unit from the mounting plate can be accomplished by gripping the finger grip with one or more fingers and then rotating the control unit outwardly away from the mounting plate. During disassembly, the configuration of the upper and lower latching mechanisms can permit the staged release of the control unit from the mounting plate, reducing the force required to remove the control unit for servicing or maintenance.

The control unit can be electrically connected to the mounting plate via a socket connector having a number of socket inlets adapted to receive several connector pins. In some embodiments, for example, the socket connector can include a terminal block coupled to the mounting plate and equipped with a number of socket inlets each adapted to receive a corresponding connector pin extending outwardly from the rear of the control unit. The socket connector can be located on a portion of the controller assembly adjacent to the finger grip in order to reduce the rotational forces or moments applied to the connector pins as the control unit is rotated away from the mounting plate.

DETAILED DESCRIPTION

The following description should be read with reference to the drawings, in which like elements in different drawings are numbered in like fashion. The drawings, which are not necessarily to scale, depict illustrative embodiments and are not intended to limit the scope of the invention. Although examples of various elements are illustrated in the various views, those skilled in the art will recognize that many of the examples provided have suitable alternatives that can be utilized. While the various devices illustrated herein are described with respect to HVAC systems, it should be understood that the present invention can be employed in other systems where the mounting of controller assemblies to a support panel is desired.

Figure 1:
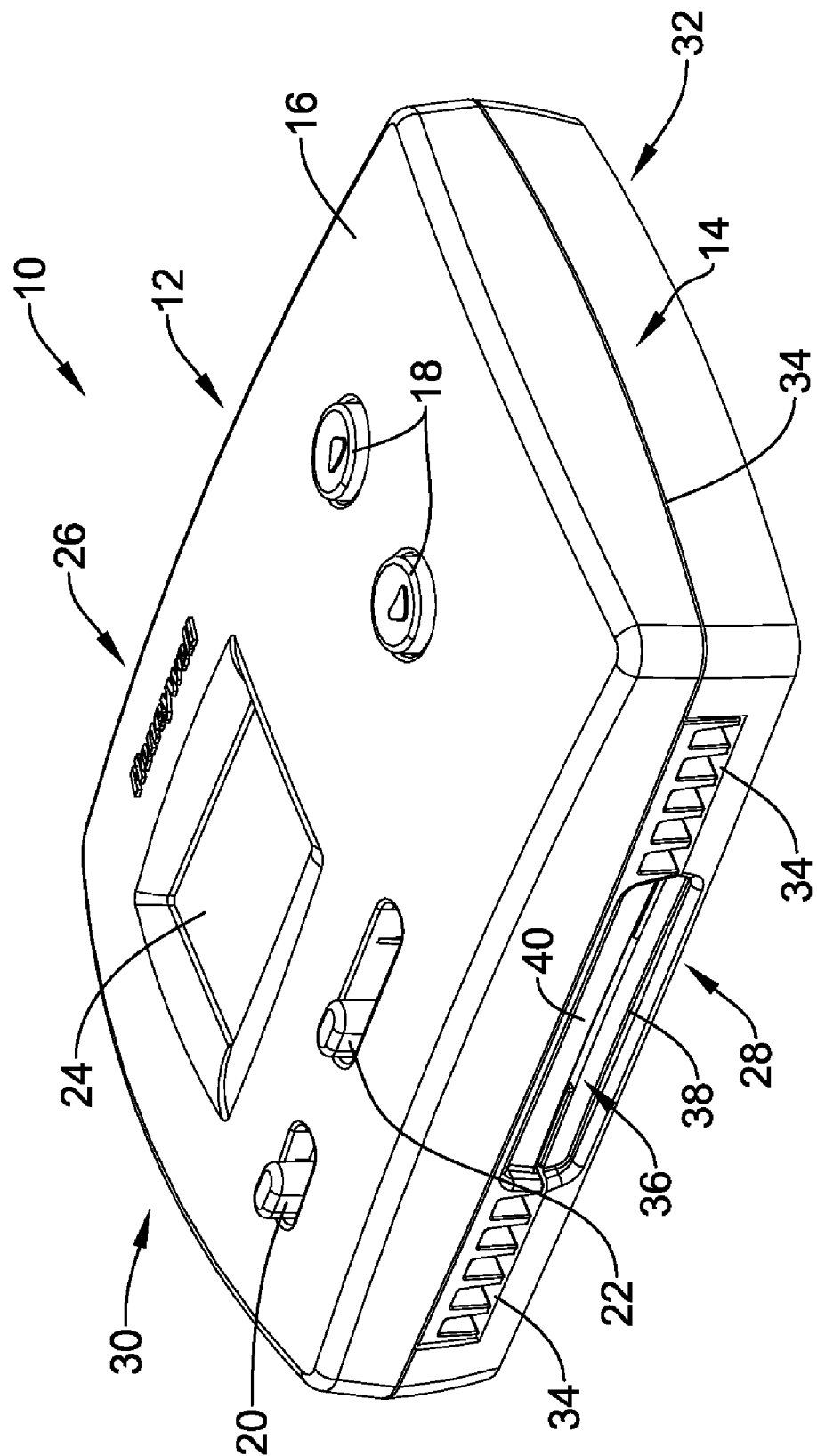
FIG. 1 is a perspective view of an illustrative controller assembly including a control unit removably attached to a mounting plate.

Referring now to FIG. 1, a perspective view of an illustrative controller assembly 10 will now be described. As shown in FIG. 1, the controller assembly 10 can include a control unit 12 removably attached to a mounting plate 14 for mounting the assembly 10 to a wall, frame, or other suitable support panel. The control unit 12 can include, for example, a thermostat, humidistat, ventilation controller, air-filtration controller, or other such control device for controlling and/or monitoring one or more heating, ventilation, and air conditioning (HVAC) components. In certain embodiments, for example, the control unit 12 can comprise a wall-mounted programmable thermostat for controlling and/or monitoring one or more HVAC components such as a furnace, boiler, air-conditioner, heat-pump, humidifier/dehumidifier, blower, and/or air-filter. It should be understood, however, that the control unit 12 could comprise other types of controllers where mounting to a wall, frame, or other such support panel is desired. Examples of other types of controllers can include, but are not limited to, sprinkler system controllers, security system controllers, home-monitoring controllers, intercom controllers, and/or lighting controllers.

In the illustrative embodiment depicted in FIG. 1, the control unit 12 includes a cover 16 which houses a number of keypad buttons 18, a number of switches 20,22, and a display unit 24 such as a liquid crystal display (LCD) panel or dot matrix display panel. The configuration of the control unit 12, including the type of interface and/or display panel provided, may vary from that shown however, depending on the application. In one alternative embodiment, for example, the cover 16 can be configured to house a touchscreen pad for inputting various user commands and for displaying status and operational information relating to the control unit 12 as well as any system component or components connected to the control unit 12.

As shown in a fully assembled position in FIG. 1, the control unit 12 can be configured to mate flush with the mounting plate 14, forming a substantially rectangular-shaped controller assembly 10 having an upper lateral section 26, a lower lateral section 28, a left lateral section 30, and a right lateral section 32. The outer edges of the control unit 12 can correspond generally to the outer edges of the mounting plate 14 along both the upper and lower lateral sections 26,28 and the left and right lateral sections 30,32, forming a common seam 34 between the two components 12,14. In some embodiments, an inset portion 36 formed in the lower lateral section 28 of the controller assembly 10 can be provided as a finger grip to facilitate removal of the control unit 12 from the mounting plate 14 for servicing or maintenance. The inset portion 36 can be formed from a first recessed surface 38 along the lower edge of the mounting plate 14 and a second recessed surface 40 along the lower edge of the control unit 12. The first and second recessed surfaces 38,40 can be located along the lower seam 34 of the control unit 12 and mounting plate 14, and can be inset a sufficient distance to permit the installer to insert one or more fingers therein to grip and rotate the control unit 12 away from the mounting plate 14.

Figure 2:
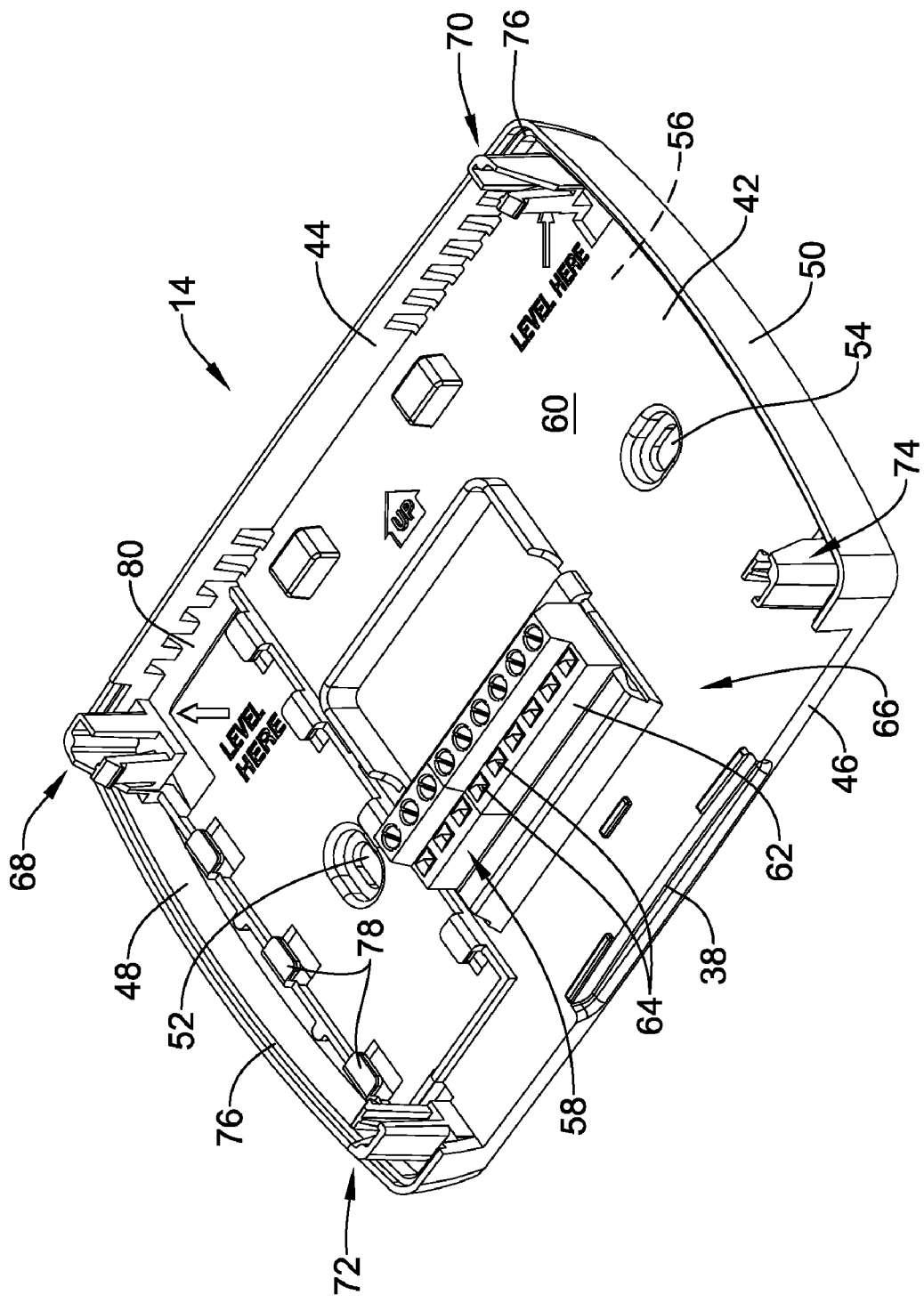
FIG. 2 is a perspective view showing the interior of the mounting plate depicted of FIG. 1.

FIG. 2 is a perspective view showing the interior of the mounting plate 14 of FIG. 1. As can be further seen in FIG. 2, the mounting plate 14 can include a plate body 42 having an upper edge 44, a lower edge 46, a left edge 48, and a right edge 50. A number of openings 52,54 extending through the body 42 can be provided to permit the mounting side 56 of the body 42 to be attached to the surface of a wall, frame, or other desired mounting location. Fastening of the mounting plate 14 can be accomplished, for example, by inserting screws, toggle bolts, nails, or other suitable fastening means through the openings 52,54 and into the panel surface.

A socket connector 58 extending outwardly from the interior side 60 of the body 42 can be provided to electrically connect the mounting plate 14 to the control unit 12. The socket connector 58 can comprise a terminal block 62 having a number of socket inlets 64 each adapted to mate with and receive therein a corresponding connector pin 124 (see FIG. 5) extending outwardly and perpendicularly from the rear of the control unit 12. The terminal block 62 can be attached to or formed integrally with the mounting plate body 42, and can be oriented such that the socket inlets 64 receive the connector pins substantially perpendicular to the panel surface upon which the mounting plate 14 is attached. In some embodiments, the terminal block 62 can be located at a lower portion 66 of the body 42 near the lower edge 46 thereof. During the process of rotating the control unit 12 upwardly away from the mounting plate 14 during disassembly, the location of the terminal block 62 at this lower portion 66 of the body 42 near where the installer grips the inset portion 36 helps to prevent the connector pins from bending or deforming as they exit the socket inlets 64. Although the terminal block 62 is shown connected to the mounting plate 14 in FIG. 2, it should be understood that the terminal block 62 may alternatively be provided on the rear of the control unit 12 to receive connector pins located on the mounting plate 14, if desired.

A number of latching mechanisms 68,70,72,74 located adjacent to the upper and lower edges 44,46 of the body 42 can be provided to removably secure the control unit 12 to the mounting plate 14. A number of upper latching mechanisms 68,70 located adjacent to the upper edge 44 of the body 42, for example, can be provided to releasably secure the upper corners of the mounting plate 14 to the control unit 12. A number of lower latching mechanisms 72,74 located adjacent to the lower edge 46 of the body 42, in turn, can be provided to releasably secure the lower corners of the mounting plate 14 to the control unit 12. The mounting plate 14 can include one or more other features for use in securing the control unit 12 to the mounting plate 14, including, for example, a lip or flange 76 located along the left and right edges 48,50, as shown. In some embodiments, several fingers 78 located on the interior side 60 of the body 42 can be provided to permit an instruction card or manual to be inserted through an opening 80 on the upper edge 44 of the body 42 for convenient storage within the mounting plate 14.

Figure 3:
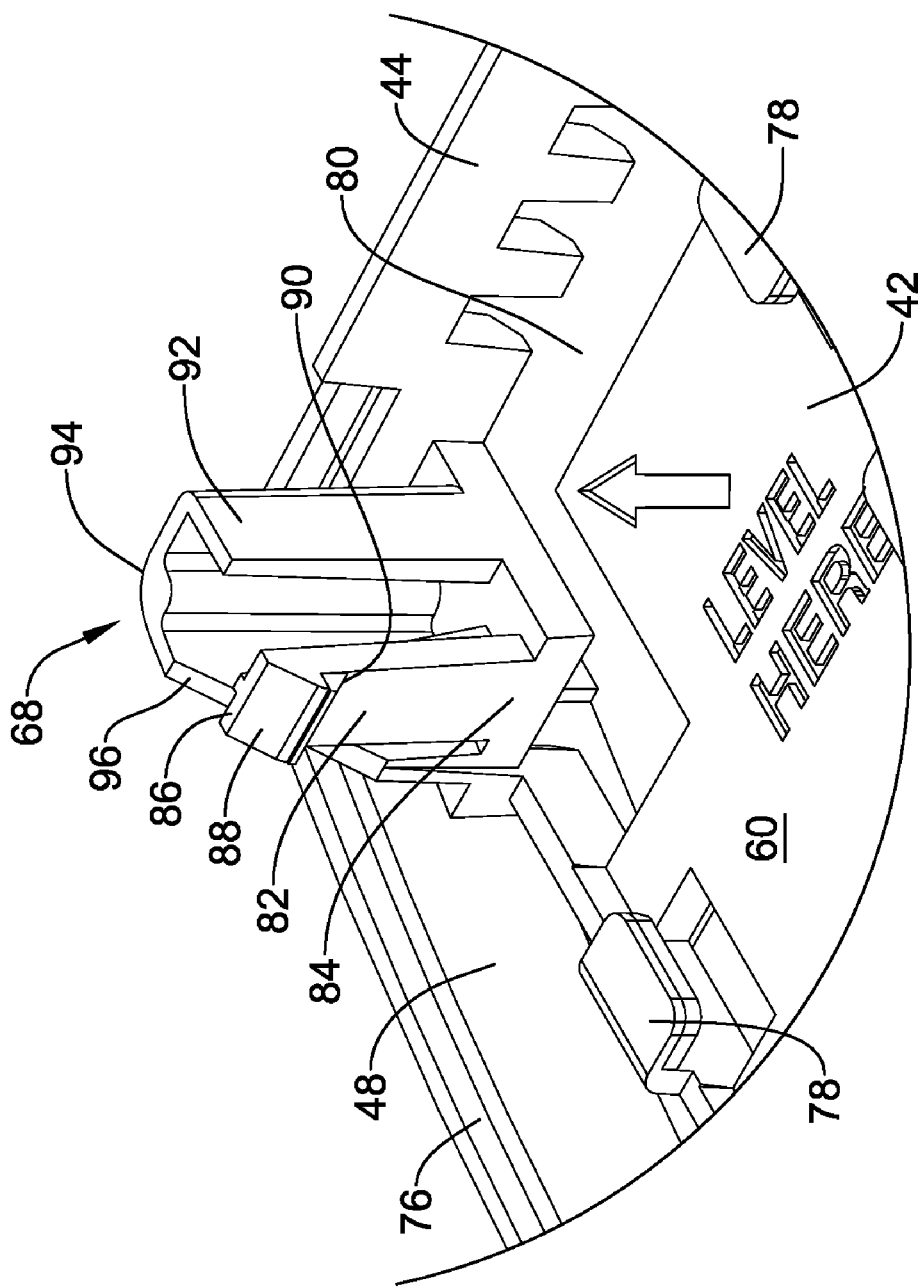
FIG. 3 is an enlarged view showing one of the upper latching mechanisms of FIG. 2 in greater detail.

FIG. 3 is an enlarged view showing one of the upper latching mechanisms 68 of FIG. 2 in greater detail. As further shown in FIG. 3, each upper latching mechanism 68,70 can include a bendable latch 82 extending outwardly at an angle substantially perpendicular to the general plane of the mounting plate body 42. The bendable latch 82 includes stationary base 84 and a bendable tip 86 adapted to bend and displace relative to a corresponding mating feature such as a mating recess on the rear of the control unit 12. A first sloped surface 88 on the tip 86 can be provided to facilitate displacement of the tip 86 with a mating feature on the control unit 12 during the assembly process. A second sloped surface 90 on the tip 86, in turn, can be provided to facilitate displacement of the latch 82 during disassembly of the control unit 12 from the mounting plate 14.

A latch shroud 92 located adjacent to each bendable latch 82 can be provided to facilitate alignment of the upper portion of the mounting plate 14 to the upper portion of the control unit 12, and to protect the bendable latch 82 from damage during assembly and/or disassembly. The latch shroud 92 can extend upwardly at an angle substantially perpendicular to the general plane of the mounting plate body 42. A first corner or edge 94 of the latch shroud 92 can be rounded so as to prevent the mounting plate 14 from being incorrectly inserted onto the control unit 12 during assembly. A second corner or edge 96 of the latch shroud 92, in turn, can be chamfered or grooved to provide clearance between the mounting plate 14 and the control unit 12 when the control unit 12 is rotated away from the mounting plate 14 during disassembly.

Figure 4:
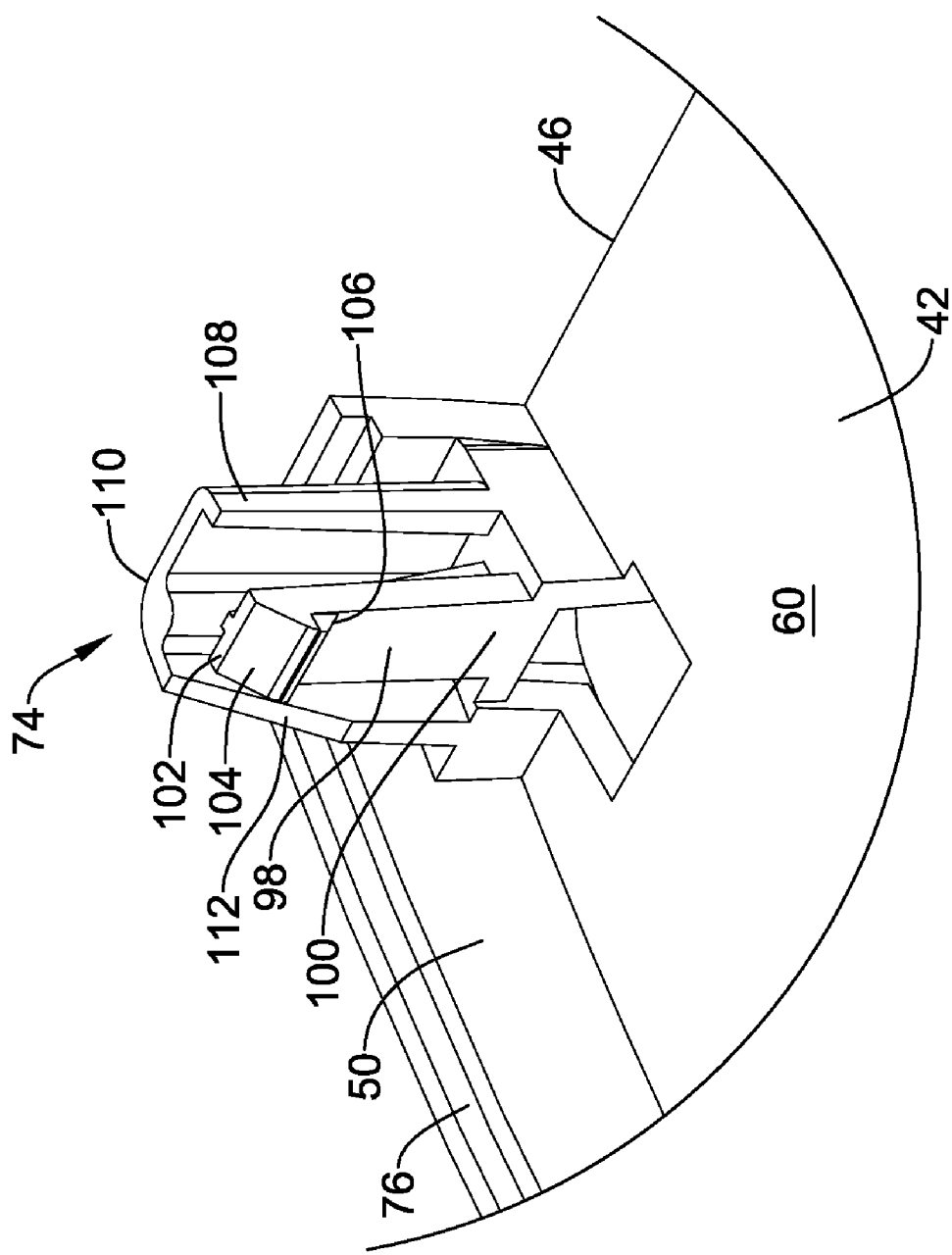
FIG. 4 is an enlarged view showing one of the lower latching mechanisms of FIG. 2 in greater detail.

FIG. 4 is an enlarged perspective view showing one of the lower latching mechanisms 74 of FIG. 2 in greater detail. Similar to the upper latching mechanisms 68,70, each lower latching mechanism 72,74 can include a bendable latch 98 extending outwardly at an angle substantially perpendicular to the general plane of the mounting plate body 42. The bendable latch 98 can include a stationary base 100 and a bendable tip 102 adapted to displace relative to a mating feature such as a mating recess on the rear of the control unit 12. A first sloped surface 104 on the tip 102 can be provided to facilitate displacement of the tip 102 with a mating feature on the control unit 12 during assembly. A second sloped surface 106 on the tip 102, in turn, can be provided to facilitate displacement of the tip 102 during disassembly of the control unit 12 from the mounting plate 14.

As with the upper latch mechanisms 68,70, a latch shroud 108 located adjacent to each bendable latch 98 can be provided to facilitate proper alignment of the lower portion of the mounting plate 14 to the lower portion of the control unit 12, and to protect the bendable latches 98 from damage during assembly and/or disassembly. The latch shroud 108 can extend upwardly at an angle substantially perpendicular to the general plane of the mounting plate body 42. A first corner or edge 110 of the latch shroud 108 can be rounded so as to prevent the mounting plate 14 from being incorrectly inserted onto the control unit 12 during assembly. A second corner or edge 112 thereof can be chamfered or grooved to provide clearance between the mounting plate 14 and the control unit 12 when the control unit 12 is rotated away from the mounting plate 14 during disassembly.

In some embodiments, the size and/or shape of the lower latch shrouds 108 can be made different than the size and/or shape of the upper latch shrouds 92 to prevent the installer from improperly attaching the control unit 12 upside-down or in reverse fashion onto the mounting plate 14. For example, the transverse profile of the upper latch shrouds 92 can be made slightly larger than the transverse profile of the lower latch shrouds 108 to prevent the installer from incorrectly inserting the upper portion of the control unit 12 onto the lower portion of the mounting plate 14. The location of the upper latch shrouds 92 relative to the lower latch shrouds 108 may also differ to prevent accidental attachment of the upper portion of the control unit 12 to the lower portion of the mounting plate 14. Other features on the mounting plate 14 such as the lip or flange 76 may be further provided to facilitate proper alignment of the control unit 12 to the mounting plate 14, if desired.

Figure 5:
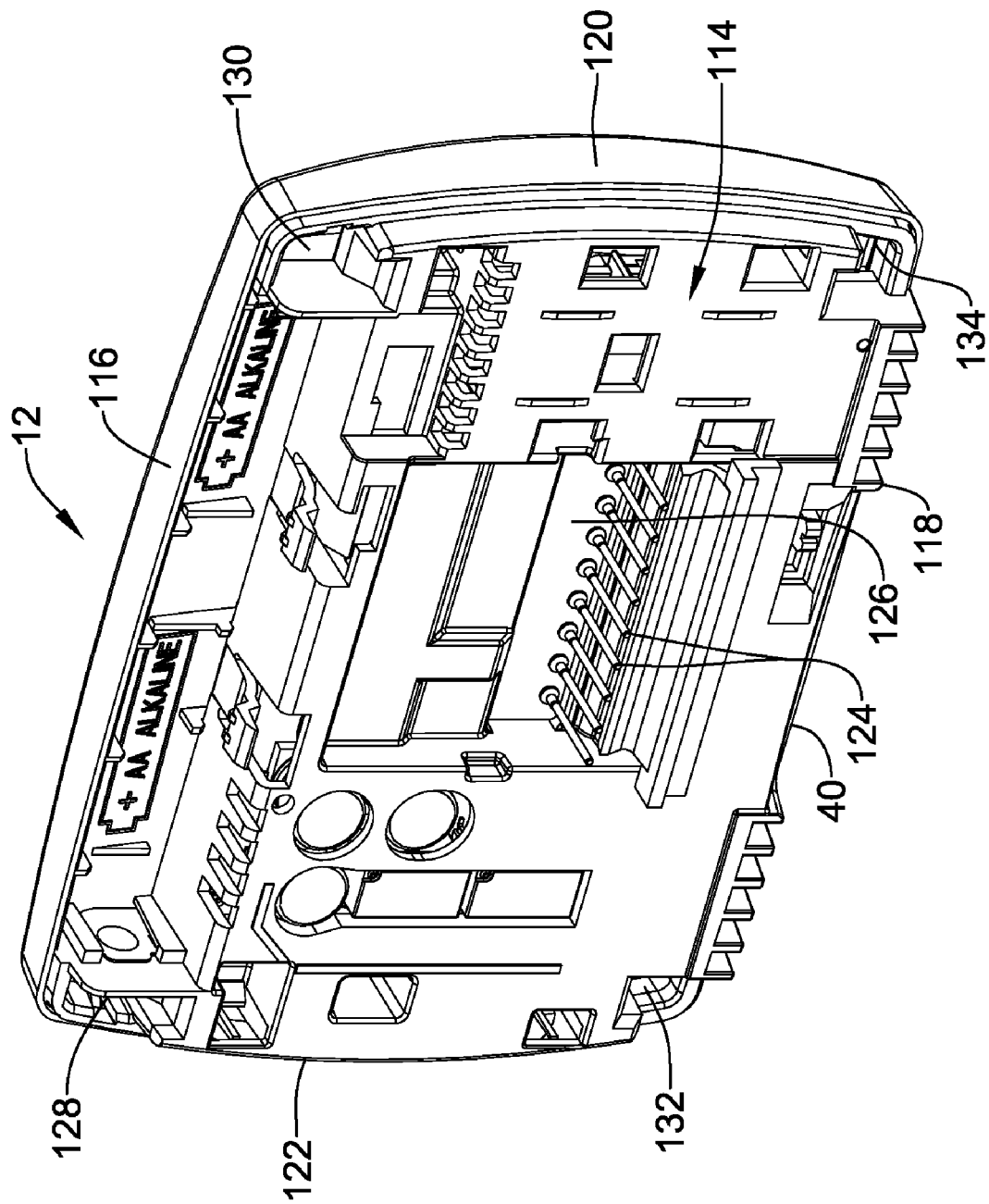
FIG. 5 is a perspective view showing the rear side of the control unit of FIG. 1.

FIG. 5 is a perspective view showing the rear 114 of the control unit 12 of FIG. 1. As shown in FIG. 5, the control unit 12 can include an upper edge 116, a lower edge 118, a left side 120, and a right side 122. A number of connector pins 124 coupled to a printed circuit board 126 within the control unit 12 can extend outwardly at an angle substantially perpendicular to the rear 114, and can be configured to fit within the socket inlets 64 of the terminal block 62 depicted in FIG. 2 providing electrical connectivity between the control unit 12 and the mounting plate 14. The connector pins 124 can be mounted to the printed circuit board 126 via surface mounting technology (SMT), wave soldering, solder-in-hole, or other suitable attachment technique. As with the terminal block 62, the connector pins 124 can be located at a lower portion of the control unit 12 near the lower edge 118 thereof. During disassembly, the location of connector pins 124 near the lower edge 118 helps to prevent the pins 124 from bending or deforming within the socket inlets 64 as the control unit 12 is pivotally removed from the mounting plate 14. This prevention in bending or deformation is due in part to the relatively large distance between the pins 124 and the hinged edge 26 of the controller assembly 10, which during disassembly reduces the moment applied to the pins 124 as the installer rotates the control unit 12 away from the mounting plate 14.

As can be further seen in FIG. 5, the rear 114 of the control unit 12 may further define a number of mating recesses 128, 130,132,134 each adapted to mate with and receive a corresponding latch 82,98 and latch shroud 92,108 from the mounting plate 14. A first number of mating recesses 128,130 located adjacent to the upper edge 116 of the control unit 12, for example, can be configured to receive therein the upper latches 82 and latch shrouds 92 located adjacent to the upper edge 44 the mounting plate 14. A second number of mating recesses 132,134 located adjacent to the lower edge 118 of the control unit 12, in turn, can be configured to receive therein the lower latches 98 and latch shrouds 108 located adjacent to the lower edge 46 of the mounting plate 14. Each of the mating recesses 128,130,132,134 may define a respective clearance area having a size and shape corresponding generally to the transverse profile of the latches 82,98 and latch shrouds 92,108. For example, the clearance area for the upper mating recesses 128,130 can be made to correspond to the general size and shape of the upper latches 82 and latch shrouds 92 whereas the clearance area for the lower mating recesses 128,130 can be made to correspond to the general size and shape of the lower latches 98 and latch shrouds 108.

Figure 6:
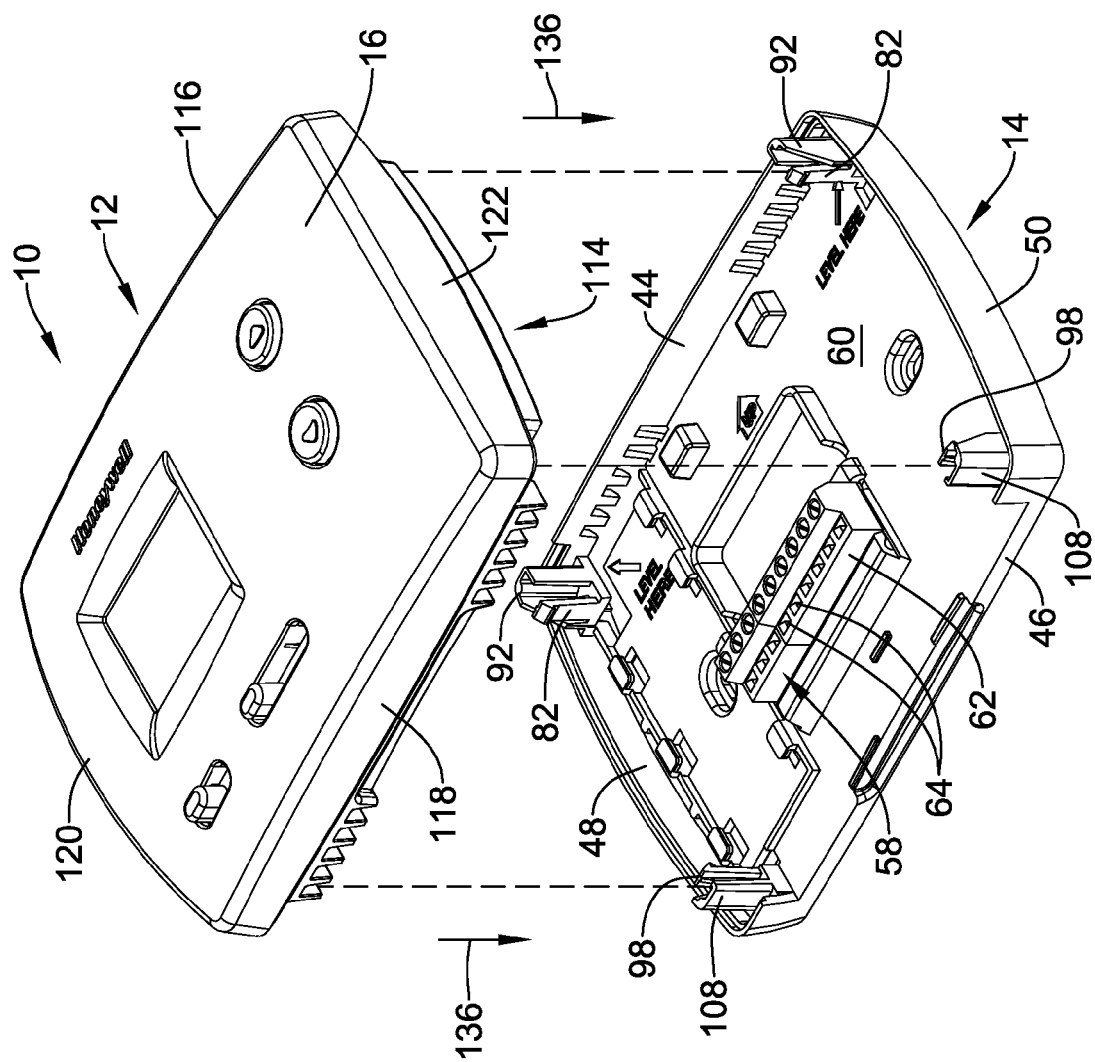
FIG. 6 is a perspective view showing the attachment of the control unit to the mounting plate.

FIG. 6 is a perspective view showing the attachment of the control unit 12 to the mounting plate 14. As can be seen in FIG. 6, the attachment of the control unit 12 can be accomplished by aligning the upper and lower edges 116,118 of the control unit 12 with the upper and lower edges 44,46 of the mounting plate 14, respectively. Once aligned squarely with the mounting plate 14, the rear 114 of the control unit 12 is then engaged normally against the latches 82,98 and latch shrouds 92,108 on the mounting plate 14 in the general direction indicated by arrow 136, causing the latches 82,98 to begin to displace. During this process, the clearance areas formed by each mating recess 128,130,132,134 prevent the latches 82,98 from deflecting unless the latch shrouds 92,108 are suitable aligned therein, preventing the installer from damaging the latches 82,98 due to improper alignment of the two components 12,14.

Once received at least in part within the mating recesses 128,130,132,134, continued engagement in the direction of arrow 136 causes the latches 82,98 to further displace and lock into place, thereby securing the control unit 12 to the mounting plate 14. As this occurs, the pins 124 extending outwardly from the printed circuit board 126 are engaged firmly within the socket inlets 64 of the terminal block 62, providing an electrical connection between the control unit 12 and the mounting plate 14. In some embodiments, the connector pins 124 can be limited in length a distance sufficient to permit good contact within the socket inlets 64 but without any excess travel therein.

Figure 8:
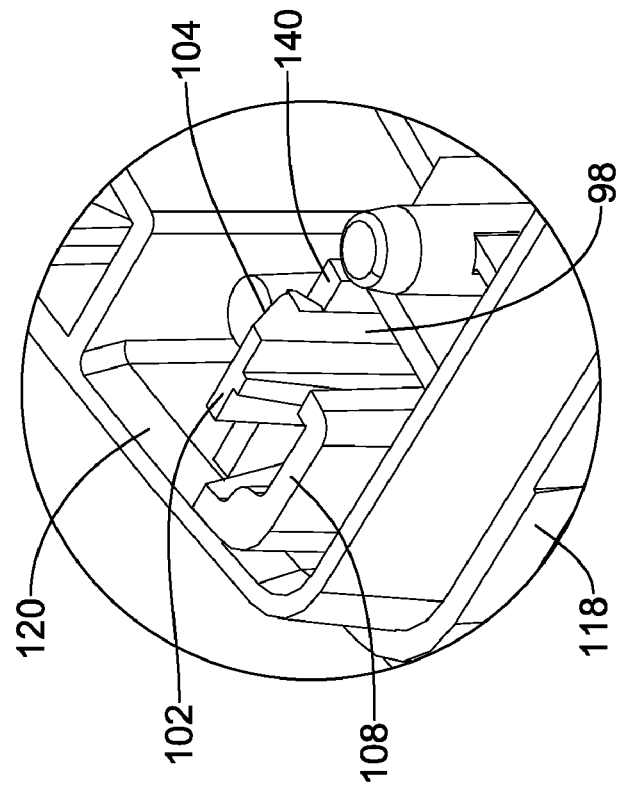
FIG. 8 is an exploded view showing one of the lower latches and latch shrouds engaged within a corresponding lower mating recess on the rear of the control unit.
Figure 7:
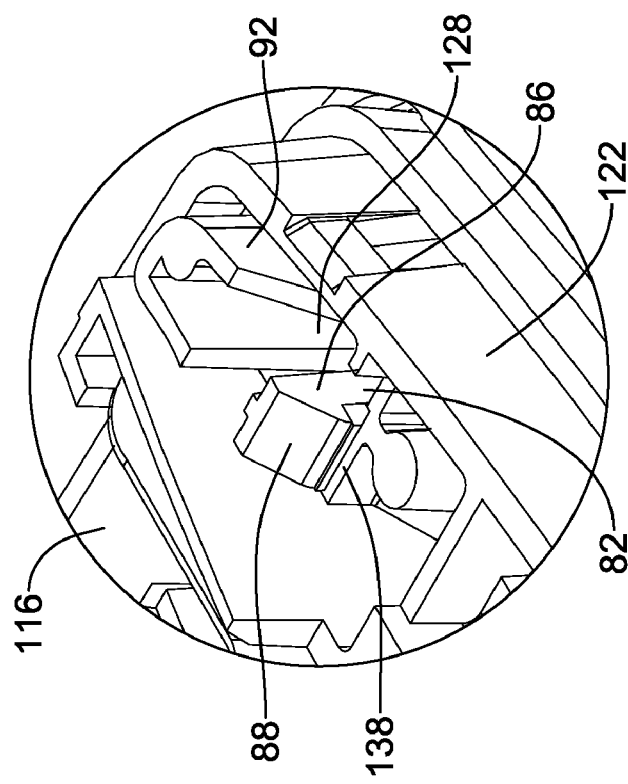
FIG. 7 is an exploded view showing one of the upper latches and latch shrouds engaged within a corresponding upper mating recess on the rear of the control unit.

Once the control unit 12 has been fully engaged against the mounting plate 14, the latches 82,98 can be configured to click into place within the mating recesses 128,130,132,134, providing the installer with tactile feedback that the control unit 12 is secured firmly in place. As shown in an exploded view in FIG. 7 with the control unit cover 16 removed to show the upper interior of the control unit 12 in greater detail, the tip 86 of each upper latch 82 can be configured to engage a surface 138 located within the upper mating recess 128, thereby securing the upper latch 82 to the rear 114 of the control unit 12. In similar fashion, and as depicted in another exploded view in FIG. 8 showing the lower interior of the control unit 12 with the cover 16 removed, the tip 102 of each lower latch 98 can be configured to engage a surface 140 located within the lower mating recess 134, thereby securing the lower latch 98 to the rear 114 of the control unit 12. A similar configuration can be utilized to secure the remaining latches 82,98 to the control unit 12.

Because the control unit 12 can be attached to the mounting plate 14 in a substantially straight manner normal to the panel surface, attachment of the control unit 12 to the mounting plate 14 may be more intuitive to the installer. In those applications where the controller assembly 10 is mounted to a wall panel, for example, the ability to attach control unit 12 to the mounting plate 14 by pushing the control unit 12 squarely in the direction of the wall may be more intuitive to the installer over hinged-mounted designs where the installer is required to rotate the control unit into place on the mounting plate to secure the two components together.

The removal of the control unit 12 from the mounting plate 14 may be performed by either pulling the control unit 12 directly away from the mounting plate 14 opposite from that depicted in FIG. 6, or alternatively by rotating the control unit 12 outwardly away from the mounting plate 14. In the latter case, for example, the installer may grip the inset portion 36 of the controller assembly 10 with one or more fingers and then rotate the control unit 12 outwardly at the lower edge of the assembly 10, causing the lower latches 98 to initially detach from the lower mating recesses 132,134 and the connector pins 124 to disengage from the socket inlets 64 of the terminal block 62. During this step, the interior arrangement of the components within the control unit 12 and mounting plate 14 can be configured so as to not interfere with each other in the rotational zone located near the lower portion of the assembly 10, thus providing a more fluid release of the control unit 12.

Figure 9:
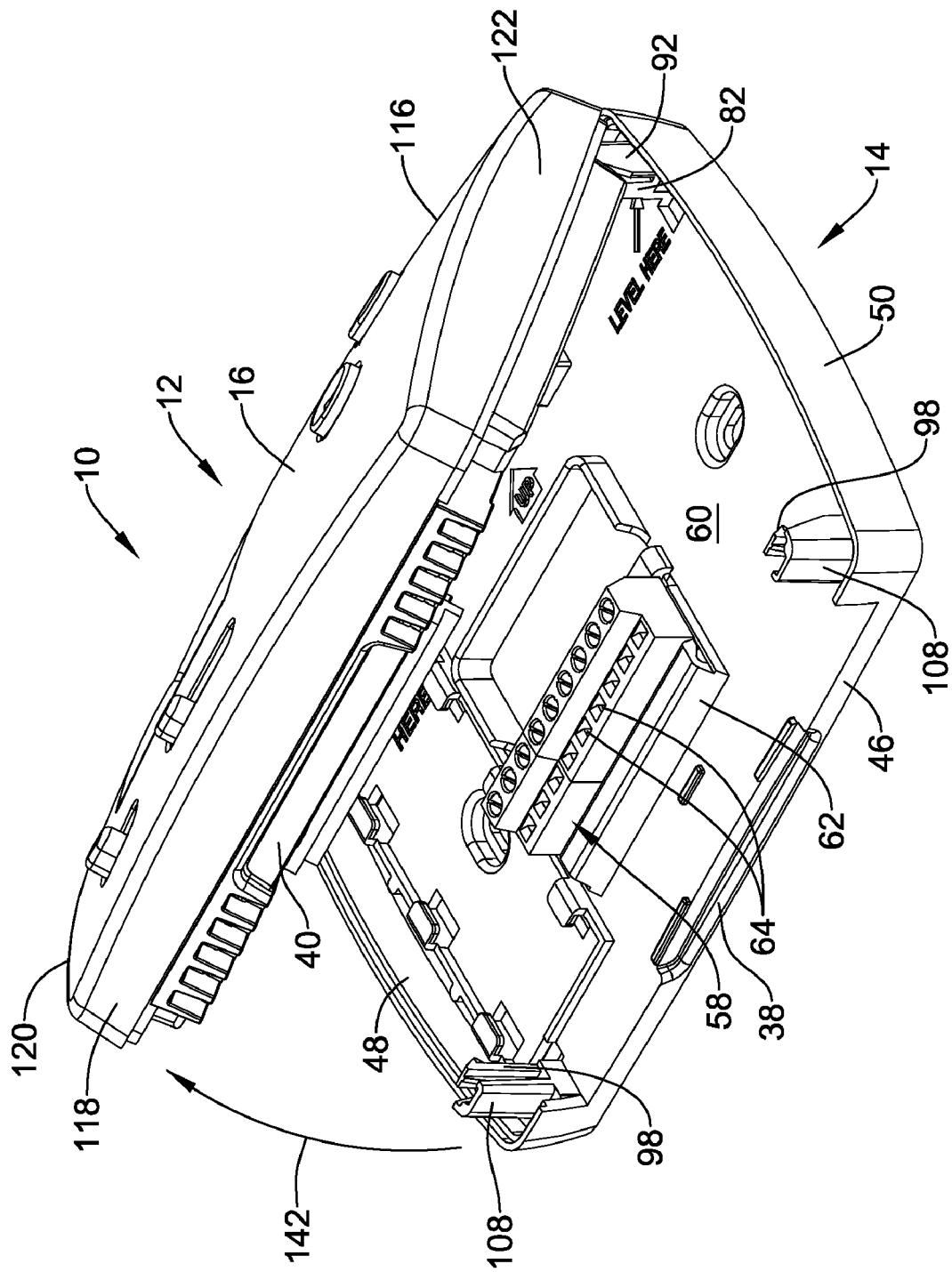
FIG. 9 is a perspective view showing the control unit partially removed from the mounting plate.

FIG. 9 is a perspective view showing the control unit 12 partially removed from the mounting plate 14 once the lower latches 98 and latch shrouds 108 have been removed from the lower mating recesses 132,134, and once the pins 124 have exited the socket inlets 64. As depicted in FIG. 9, once the installer has disengaged the lower latches 98 and latch shrouds 108, continued rotation of the control unit 12 in the direction indicated generally by arrow 142 causes the control unit 12 to swing further away from the mounting plate 14, causing the upper latches 82 and latch shrouds 92 to begin to disengage from the upper mating recesses 128,130. Continued rotation of the control unit 12 in this manner causes the upper latches 82 and latch shrouds 92 to then disengage, allowing the installer to remove the control unit 12 from the mounting plate 14. Once disassembled, the installer may then perform the desired servicing or maintenance on the control unit 12, and then reattach the control unit 12 to the mounting plate 14 in the manner described above with respect to FIG. 6.

By staging the release of the control unit 12 from the mounting plate 14 beginning with the lower latches 98 and latch shrouds 108 in an initial stage and then subsequently with the upper latches 82 and latch shrouds 92 in a second stage, the force required for the installer to detach the control unit 12 from the mounting plate 14 during each stage is less than that of conventional disassembly techniques, which typically require the installer to detach each of the latches simultaneously. Moreover, since the terminal block 62 is located near the lower portion of the controller assembly 10 adjacent to the location of the finger grip, the moments applied to the connector pins 124 are reduced, resulting in less bending or deformation of the pins 124 during disassembly. In those embodiments where the connector pins 124 are surface mounted onto the printed circuit board 126, for example, the reduction of this moment on the pins 124 may decrease the likelihood of the pins 124 from detaching from the surface mounts, thus rendering the controller assembly 10 more compatible with surface mounting techniques.

Having thus described the several embodiments of the present invention, those of skill in the art will readily appreciate that other embodiments may be made and used which fall within the scope of the claims attached hereto. Numerous advantages of the invention covered by this document have been set forth in the foregoing description. It will be understood that this disclosure is, in many respects, only illustrative. Changes can be made with respect to various elements described herein without exceeding the scope of the invention.

What is claimed is:

1. A controller assembly, comprising:
a mounting plate including a plate body having a mounting side, a non-mounting side, an upper edge, and a lower edge, said mounting plate defining a number of latching mechanisms at least one of which includes a latch shroud and a corresponding bendable latch disposed adjacent to the latch shroud, wherein the latch shroud is spaced inward from the upper edge and/or lower edge of the mounting plate and includes a tapered edge facing toward the bendable latch;

a socket connector defining a number of socket inlets;

a control unit releasably attachable to the mounting plate and including an upper edge and a lower edge, the control unit including a number of mating recesses each defining a clearance area configured to receive a corresponding latching mechanism including a corresponding latch shroud; and a number of connector pins each configured to engage a corresponding socket inlet of the socket connector;

wherein the latch shroud is configured and positioned relative to the bendable latch such that the latch shroud of the mounting plate interacts with a corresponding mating recess of the control unit to facilitate alignment of the control unit with the mounting plate when attaching the control unit to the mounting plate.

2. The controller assembly of claim 1, wherein a lower lateral edge of the controller assembly defines a finger grip.

3. The controller assembly of claim 2, wherein the finger grip comprises an inset portion of the controller assembly including a first recessed section along the lower edge of the mounting plate and a second recessed section along the lower edge of the control unit.

4. The controller assembly of claim 1, wherein said number of latching mechanisms comprises:

one or more upper latching mechanisms each including an upper bendable latch disposed adjacent to a corresponding upper latch shroud; and one or more lower latching mechanisms each including a lower bendable latch disposed adjacent to a corresponding lower latch shroud.

5. The controller assembly of claim 4, wherein the lower latching mechanisms and upper latching mechanisms are configured to permit a staged disassembly of the control unit from the mounting plate.

6. The controller assembly of claim 4, wherein the profile of the upper latch shrouds is different than the profile of the lower latch shrouds.

7. The controller assembly of claim 1, wherein each mating recess includes a mating surface configured to releasably secure to the bendable latch.

8. The controller assembly of claim 1, wherein detachment of the control unit from the mounting plate includes rotating the control unit away from the mounting plate.

9. The controller assembly of claim 8, wherein assembly of the control unit to the mounting plate can be accomplished in a substantially straight manner normal to the mounting plate.

10. The controller assembly of claim 9, wherein the socket connector is located on a lower half of the mounting plate toward the lower edge thereof.

11. The controller assembly of claim 1, further comprising a printed circuit board, wherein the connector pins are surface mounted to the printed circuit board.

12. The controller assembly of claim 1, wherein the socket connector is a terminal block.

13. The controller assembly of claim 1, wherein the control unit is a thermostat.

14. A controller assembly, comprising:

a mounting plate including a plate body having a mounting side, a non-mounting side, an upper edge, and a lower edge, said mounting plate defining a number of upper latching mechanisms and a number of lower latching mechanisms, at least one of said upper and lower latching mechanisms each including a latch shroud and a bendable latch disposed adjacent to the latch shroud, wherein the latch shroud is disposed between the bendable latch and an edge of the mounting plate and extends up from a base at the mounting plate to a terminating end, and wherein at least one of the latch shrouds of an upper latching mechanism includes a tapered edge surface facing the bendable latch that is configured to be spaced further from the bendable latch toward the terminating end of the latch shroud than toward the base of the latch shroud;

a socket connector coupled to the mounting plate, the socket connector defining a number of socket inlets;

a control unit releasably attachable to the mounting plate and including an upper edge, a lower edge, and a rear, the rear of the control unit including a number of mating recesses each defining a clearance area for receiving a corresponding latching mechanism including the at least one latch shroud, the tapered surface of the at least one latch shroud is configured to provide clearance such that the corresponding mating recess does not interference with the latch shroud when a lower edge of the control unit is rotated upward relative to the mounting plate; and a circuit board including a number of connector pins extending outwardly from the rear of the control unit, each connector pin is configured to engage a corresponding socket inlet of the socket connector.

15. A controller assembly, comprising:

a mounting plate including a plate body having a mounting side, a non-mounting side, an upper edge, and a lower edge, said mounting plate defining a number of upper latching mechanisms and a number of lower latching mechanisms, at least one of said upper and lower latching mechanisms including a bendable latch disposed adjacent to a corresponding latch shroud;

a socket connector defining a number of socket inlets;

a control unit releasably attachable to the mounting plate and including an upper edge and a lower edge, the control unit including a number of mating recesses each defining a clearance area that is configured to receive a corresponding latching mechanism including a corresponding latch shroud if present; and a number of connector pins each adapted to engage a corresponding socket inlet of the socket connector;

wherein the latch shrouds of said upper and lower latching mechanisms are configured and positioned relative to their corresponding bendable latches such that the latch shrouds of the mounting plate interact with corresponding mating recesses of the control unit to facilitate alignment of the control unit with the mounting plate during assembly of the control unit with the mounting plate; and wherein said upper and lower latching mechanisms are configured to permit the control unit to be initially rotated away from the mounting plate during disassembly, and the control unit to be engaged against the mounting plate in a substantially straight manner normal to the mounting plate during assembly.

16. A mounting plate for mounting a controller to a surface, the mounting plate comprising:

a plate body having a mounting side, a non-mounting side, a first edge, and a second edge opposite the first edge, said mounting plate defining a first number of latching mechanisms adjacent to the first edge of the plate body and a second number of latching mechanisms adjacent to the second edge of the plate body, at least one of said first and second latching mechanisms including a bendable latch adjacent to a latch shroud, wherein the latch shroud has a first wall and a second wall with the first wall extending substantially perpendicular to the second wall, and wherein the second wall extending away from the first wall and in a direction away from the first edge of the plate body and generally toward the bendable latch and includes a tapered edge facing the corresponding bendable latch; and a socket connector coupled to the plate body and defining a number of socket inlets.

17. The mounting plate of claim 16, wherein the profile of the latch shrouds of said first number of latching mechanisms is different than the profile of the latch shrouds of said second number of latching mechanisms.

18. The mounting plate of claim 16, wherein the socket connector is a terminal block.

19. The mounting plate of claim 16, wherein the plate body includes a recessed section along one of said first and second mounting plate edges, said recessed section adapted to align with a recessed section on a controller.

* * * * *